(12) United States Patent
Ouyang et al.

(10) Patent No.: US 7,679,121 B2
(45) Date of Patent: *Mar. 16, 2010

(54) ULTRA SCALABLE HIGH SPEED HETEROJUNCTION VERTICAL N-CHANNEL MISFETS AND METHODS THEREOF

(75) Inventors: Qiqing Christine Ouyang, Yorktown Heights, NY (US); Jack Oon Chu, Manhasset Hills, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/114,168

(22) Filed: May 2, 2008

(65) Prior Publication Data

US 2008/0237637 A1 Oct. 2, 2008

Related U.S. Application Data

(63) Continuation of application No. 11/735,711, filed on Apr. 16, 2007, now Pat. No. 7,453,113.

(51) Int. Cl.
*H01L 27/108* (2006.01)

(52) U.S. Cl. ............... 257/302; 438/156; 257/E27.054; 257/E29.131; 257/E21.375

(58) Field of Classification Search ........... 257/191, 257/192, 302, 328, 616, 220, E27.054, E27.096, 257/E29.131, E29.183, E29.189, E29.262, 257/E29.313, E21.375, E21.41, E21.629; 438/138, 206, 268, 156
See application file for complete search history.

(56) References Cited

U.S. PATENT DOCUMENTS

| 5,285,088 | A | 2/1994 | Sato et al. |
|---|---|---|---|
| 5,847,419 | A | 12/1998 | Imai et al. |
| 5,914,504 | A | 6/1999 | Augusto |
| 5,920,088 | A | 7/1999 | Augusto |
| 5,963,800 | A | 10/1999 | Augusto |
| 6,190,975 | B1 | 2/2001 | Kubo |
| 6,207,977 | B1 | 3/2001 | Augusto |
| 6,319,799 | B1 | 11/2001 | Ouyang et al. |
| 6,524,935 | B1 | 2/2003 | Canaperi et al. |

(Continued)

FOREIGN PATENT DOCUMENTS

JP 10-22501 1/1998

(Continued)

OTHER PUBLICATIONS

Kogyo, Nikkan, paragraph of "Heterojunction" in Dictionary of Semiconductor Terms, by Japan editorial committee of "Dictionary of Semiconductor Terms," Shinnbun, Mar. 20, 1999 and English translation thereof.

*Primary Examiner*—Quoc D Hoang
(74) *Attorney, Agent, or Firm*—McGinn IP Law Group, PLLC; Louis Percello, Esq.

(57) ABSTRACT

A method for forming and the structure of a strained vertical channel of a field effect transistor, a field effect transistor and CMOS circuitry is described incorporating a drain, body and source region on a sidewall of a vertical single crystal semiconductor structure wherein a hetero-junction is formed between the source and body of the transistor, wherein the source region and channel are independently lattice strained with respect to the body region and wherein the drain region contains a carbon doped region to prevent the diffusion of dopants (boron) into the body. The invention reduces the problem of leakage current from the source region via the hetero-junction and lattice strain while independently permitting lattice strain in the channel region for increased mobility via choice of the semiconductor materials.

22 Claims, 9 Drawing Sheets

U.S. PATENT DOCUMENTS

| | | |
|---|---|---|
| 6,544,833 B2 | 4/2003 | Kawakubo |
| 6,780,725 B2 | 8/2004 | Fujimaki |
| 6,927,414 B2 | 8/2005 | Ouyang et al. |
| 6,943,407 B2 * | 9/2005 | Ouyang et al. ............. 257/329 |
| 7,042,052 B2 | 5/2006 | Bhattacharyya |
| 7,453,113 B2 * | 11/2008 | Ouyang et al. ............. 257/302 |
| 2004/0065927 A1 | 4/2004 | Bhattacharyya |

FOREIGN PATENT DOCUMENTS

| | | |
|---|---|---|
| JP | 10-112543 | 4/1998 |
| JP | 2002-57329 | 2/2002 |

* cited by examiner

ULTRA SCALABLE HIGH SPEED HETEROJUNCTION VERTICAL N-CHANNEL MISFETS AND METHODS THEREOF

CROSS REFERENCE TO RELATED APPLICATIONS

The present application is a Continuation application of U.S. patent application Ser. No. 11/735,711 filed Apr. 16, 2007 now U.S. Pat. No. 7,453,113.

This application is cross referenced to U.S. patent application Ser. No. 10/463,039 filed Jun. 17, 2003, now U.S. Pat. No. 6,943,407 by Q. Ouyang and Jack O. Chu, the inventors herein, filed herewith, entitled "Low Leakage Heterojunction Vertical Transistors and High Performance Devices Thereof" which is directed to a vertical p-channel MOSFET which is incorporated herein by reference and assigned to the assignee herein.

This application is further cross referenced to U.S. patent application Ser. No. 10/462,933, filed Jun. 17, 2003, now U.S. Pat. No. 6,927,414, by Q. Ouyang and Jack O. Chu, the inventors herein, filed herewith, entitled "High Speed Lateral Heterojunction MISFETS Realized by 2-dimensional Bandgap Engineering and Methods Thereof" which is directed to lateral heterojunction MISFETs which is incorporated herein by reference and assigned to the assignee herein.

FIELD OF THE INVENTION

This invention relates to semiconductor transistors and, more particularly, to a metal insulator semiconductor field effect transistor (MISFET) consisting of a conducting channel which has no hetero-barrier in the current flow direction and a heterojunction between the source/drain and body (bulk) of the transistor.

BACKGROUND OF THE INVENTION

Silicon MOSFET scaling has become a major challenge in the semiconductor industry. Traditional techniques start to fail in reducing certain undesirable physical effects as device dimensions shrink down to the nanometer regime. For example, anti-punchthrough (APT) or halo implantation is used to reduce the short-channel effects (SCE). However, the abrupt doping profiles are difficult to achieve due to temperature enhanced diffusion, and these highly doped channels or pocket implant regions increase junction capacitance and band-to-band tunneling. It has been shown by S. Thompson, et al., in "MOS scaling: transistor challenges for the 21st century," Intel Technology Journal, Q3, 1998, that channel engineering can only decrease the circuit gate delay by ~10% for a given technology, and it cannot provide channel length scaling for generation after generation that gate oxide and source/drain (S/D) junction depth scaling has provided.

With bandgap engineering, an important degree of freedom can be provided in the device design. The growth of high-quality tensile strained Si/SiGe and compressively strained SiGe/Si heterostructures by molecular beam epitaxy (MBE), various types of chemical vapor deposition (CVD), and/or ion implantation allows incorporation of bandgap engineering concepts into a mature silicon technology.

Bandgap engineering has been utilized to realize various types of heterojunction field effect transistors (HFETs). The most widely studied is the modulation doped field effect transistors (MODFET), in which a quantum well is used to confine the carriers in a lightly doped semiconductor (See K. Ismail, "Si/SiGe High-Speed Field-Effect Transistors", *IEDM, Technology Digest*, p. 509-512, 1995). Higher carrier mobility can be achieved due to reduced impurity scattering, reduced surface roughness scattering in the buried channel, and strained-induced mobility enhancement, if any, depending on the hetero material system employed. Derived from the same concept, various types of heterostructure CMOS devices have also been proposed and studied (See M. A. Armstong, et al., "Design of Si/SiGe Heterojunction Complementary Metal-Oxide Semiconductor Transistors", *IEDM Technology Digest*, p. 761-764, 1995; S. Imai et al., "Si—SiGe Semiconductor Device and Method of Fabricating the Same", U.S. Pat. No. 5,847,419; and M. Kubo, et al., "Method of Forming HCMOS Devices with a Silicon-Germanium-Carbon compound Semiconductor Layer", U.S. Pat. No. 6,190,975, Feb. 20, 2001.) The advantage of these devices is the higher carrier mobility and hence high drive current and high speed. However, two prominent problems still remain in these planar devices: device scaling and control of short-channel effects.

In planar FET devices, the channel length is limited by lithography. This problem can be solved if the devices are fabricated in a vertical fashion, in which case the channel length is only determined by epitaxial techniques. Similarly, the diffusion problem of boron and phosphorus in the source/drain can be reduced by introducing thin SiGeC layers in the source/drain to achieve ultra scalable vertical transistors, as shown by Y. Ming, et al., in "25-nm p-Channel vertical MOSFET's with SiGeC source-drains", *IEEE, Electron Device Letters*, vol. 20, no. 6, 1999, and by H. Rücker et al., in "Dopant diffusion in C-doped Si and SiGe: physical model and experimental verification," *IEDM, Technical Digest*, p. 345-8, 1999.

As for short-channel effects, other than ultra-steep retrograded channel profiles and ultra-shallow source/drain junctions, silicon-on-insulator (SOI) has been used to control short-channel effects. However, SOI does not remove short-channel effects completely, and an inherent problem with SOI is the floating body effect. Another way to reduce the short-channel effect is to have a built-in energy barrier at the source/body junction, and in particular a barrier where the barrier height does not depend on the applied bias. The band offset provided by a heterojunction is very suitable in this case. A heterojunction MOSFET (HJMOSFET) has been proposed and studied by S. Hareland, et al., in "New structural approach for reducing punchthrough current in deep submicrometer MOSFETs and extending MOSFET scaling," *IEEE Electronics Letters*, vol. 29, no. 21, pp. 1894-1896, October 1993, and by X. D. Chen, et al., in "Vertical P-MOSFETS with heterojunction between source/drain and channel," Device Research Conference, Denver, June 2000.

A p-channel/n-channel, complementary vertical MISFET device and a specific application of such devices in dynamic random access memory (DRAM) are described in U.S. Pat. No. 5,920,088, No. 6,207,977, No. 5,963,800, and No. 5,914,504, respectively. A heterojunction is utilized at the source/channel junction in the vertical devices. Even though very short channels may be achieved and short-channel effects may be reduced, there is still a big drawback with such device structures. At the off state (i.e., zero bias at the gate and high bias at the drain), the hetero-barrier is useful in reducing the drain-induced barrier lowering (DIBL), bulk punchthrough and therefore, off-state leakage current. However, at the on state (i.e., high bias at the gate and drain), the built-in hetero-barrier becomes harmful to the drive current. This is because the hetero-barrier at the source/channel junction severely blocks the thermal emission of the carriers from the source into the channel. The only way for carrier injection is the quantum mechanical tunneling across the barrier, which becomes the bottleneck of the transport in the channel.

The so-called ballistic transport after crossing the barrier in the channel mentioned in these references will not occur due to strong surface roughness scattering. Therefore, the drive current in such devices is significantly reduced. Additionally, since a part of the source (close to the channel) of such a device is undoped, the drive current will be further reduced by high series resistance in the source. A detailed study has been performed by Q. Ouyang, et al., in "Two-Dimensional Bandgap Engineering in Novel pMOSFETs," *SISPAD*, Seattle September, 2000, and by X. D. Chen, et al., in "Vertical P-MOSFETS with heterojunction between source/drain and channel", *Device Research Conference*, Denver, June, 2000.

Recently, a lateral high mobility, buried, p-channel heterojunction transistor (HMHJT) has been proposed by Q. Ouyang, et al., in U.S. Pat. No. 6,319,799B1. A detailed simulation study has been performed by Q. Ouyang, et al., in "A Novel Si/SiGe Heterojunction pMOSFET with Reduced Short-Channel Effects and Enhanced Drive Current," IEEE Transactions on Electron Devices, 47 (10), 2000. The device has been realized using a vertical structure by Q. Ouyang, et al., in "Fabrication of a Novel Vertical pMOSFET with Enhanced Drive Current and Reduced Short-Channel Effects and Floating Body Effects", VLSI Symposium, Kyoto, June 2001. In this case, compressively strained SiGe on Si is used to realize a high performance pMOSFET. However, in order to realize circuits using complementary MOSFETs, a high-performance, vertical nMOSFET is also needed. In the present invention, we propose a heterojunction nMOSFET, which has low leakage and high drive current. Six embodiments are illustrated and the methods thereof are also described.

U.S. Pat. No. 5,285,088 describes a "High Electron Mobility Transistor". This device has a pair of semiconductor layers for source/drain electrodes consisting of a poly SiGe layer and a poly Si layer so as to form a partially projected "overhanging-shape" over the active area. In this case, the source/drain and the gate are self-aligned. However, it is a planar structure and still suffers from the short-channel effects.

SUMMARY OF THE INVENTION

The objective of this invention is to provide a device structure that has superb performance and scalability. By using 2-dimensional bandgap engineering, the tradeoffs in the conventional Si technology can be avoided, and the drive current and leakage current can be optimized independently. Consequently, very high drive current and excellent turn-off characteristics can be achieved simultaneously. Moreover, the suppression of short-channel effects in such a device further allows continuous and more aggressive scaling of the MOSFET technology.

This invention describes a n-channel MISFET structure having these advantages with various embodiments. Another aspect of this invention is the process integration for such devices. The devices described in this invention have at least a hetero-barrier between the source and the body of the transistor, however, no hetero-barrier in the channel along the current flow direction. Drain induced barrier lowering is substantially reduced due to the hetero-barrier at the source junction, hence, the substhreshold swing and off-state leakage are reduced. Meanwhile, the drive current is not limited by quantum mechanical tunneling since there is no hetero-barrier in the channel. Therefore, with these devices, very high on/off ratio can be achieved. Such devices are superb for high speed, low leakage and low power applications, such as DRAM, laptop computers, and wireless communications.

Any hetero-material systems with the proper band offset may be used to realize the device concept such as silicon-based or III-V material systems. Since silicon technology is the most mature, silicon based materials are the most economically feasible and attractive. There are two Si-based heterostructures which have the suitable band offset for electrons in nMISFETs. One is tensile strained Si or SiGe on relaxed SiGe buffer layers, and the other is tensile strained $Si_{1-x-y}Ge_xC_y$ on relaxed Si. With each material system, the channel could be a surface channel or a buried quantum well channel.

The carrier mobility depends not only on the strain in the crystal, but also on crystal orientation. A recent study showed that hole mobility is enhanced significantly on a (110) substrate along <110> direction, while the electron mobility remains highest on a (100) substrate along <100> direction for devices with a gate oxide less than 2 nm and a gate length less than 150 nm. Therefore, all the embodiments in the present invention have a channel preferably in (100) plane and along <100> direction.

In the present invention, six embodiments for a vertical n-channel transistor, are illustrated. The fabrication method for each embodiment is also described.

BRIEF DESCRIPTION OF THE DRAWINGS

The invention is described in more details thereinafter relative to non-limitative embodiments and with reference to the attached drawings, wherein.

DETAILED DESCRIPTION OF THE PREFERRED EMBODIMENTS

Figure 1:
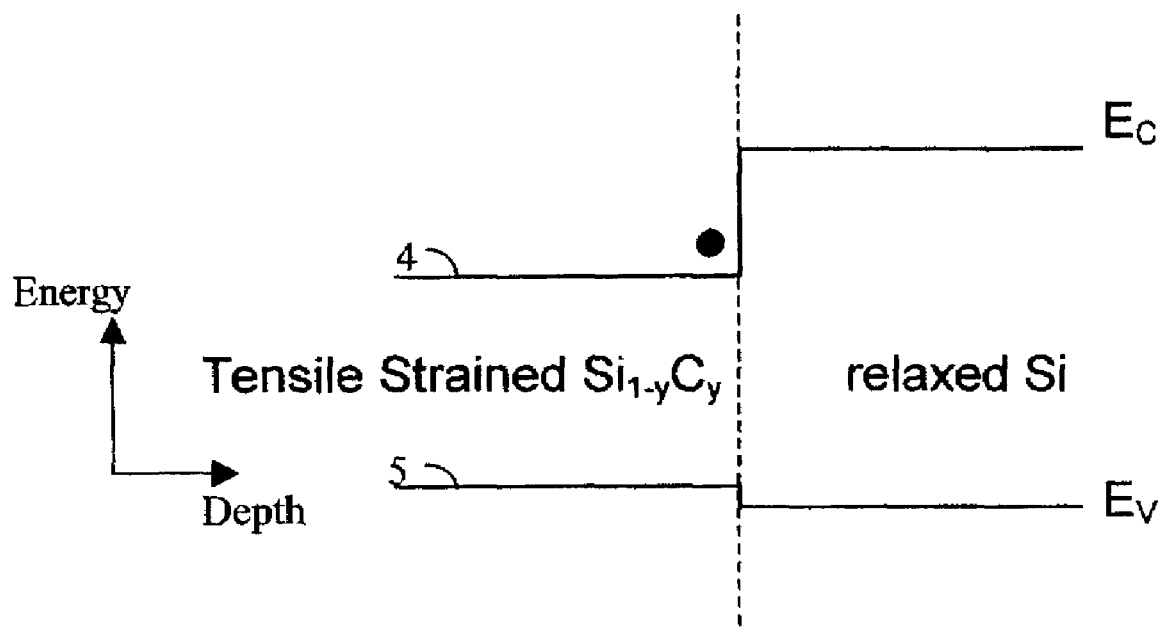
FIG. 1 is an energy band diagram of tensile strained SiC on cubic Si.
Figure 2:
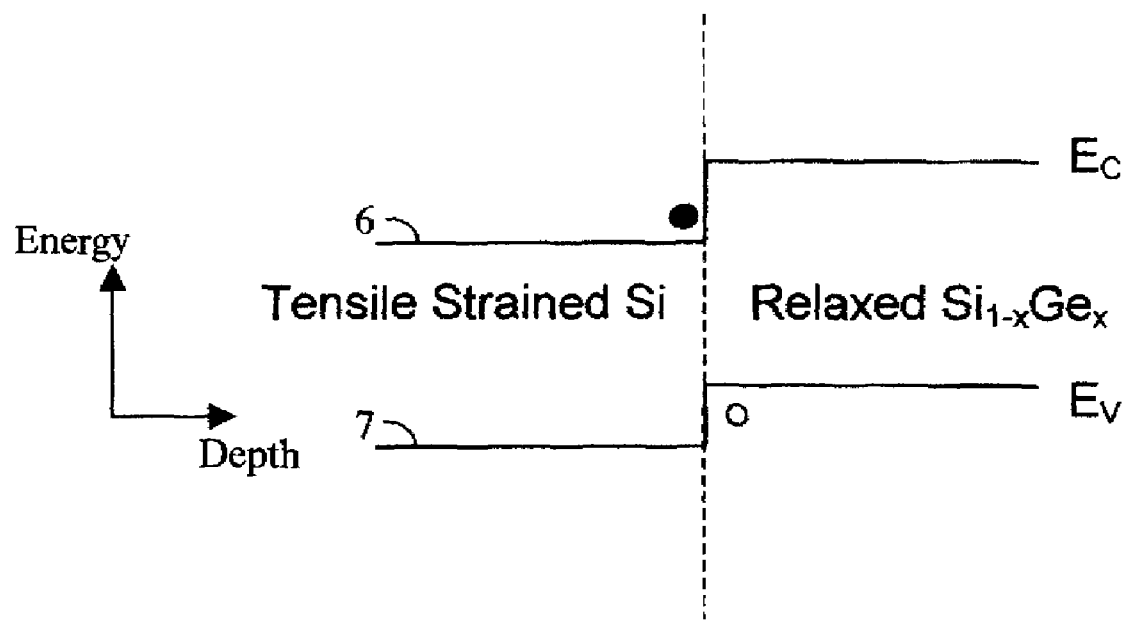
FIG. 2 is an energy band diagram of tensile strained Si on relaxed SiGe buffer.

The lattice spacing of carbon, silicon and germanium are 3.567 Å, 5.431 Å and 5.646 Å, respectively. Biaxial tensile strain exists in pseudomorphic SiC on relaxed Si, or in pseudomorphic Si on relaxed SiGe or Ge substrate, which means the larger lattice spacing in the growth plane (surface) and smaller lattice spacing in the growth direction (normal to the surface) in the pseudomorphic material. On the other hand, compressive strain exists in pseudomorphic SiGe on relaxed Si, or in pseudomorphic Ge on relaxed SiGe, which means the smaller lattice spacing in the growth plane (surface) and larger lattice spacing in the growth direction (normal to the surface) in the pseudomorphic material. Adding a small amount of carbon (<1%) into compressively strained SiGe on relaxed Si can compensate and reduce the strain in SiGe. Strain changes the band structure of the strained material. Therefore, strain may affect the energy band offset, effective mass and density of states. Referring to the drawing, FIG. 1 shows the conduction band and valence band of tensile strained $Si_{1-y}C_y$ on relaxed Si buffer layer by curves 4 and 5, respectively. In this case, electrons are confined in the tensile strained $Si_{1-y}C_y$ which has high electron mobility, and this material system is suitable for nMOSFETs. Furthermore, FIG. 2 shows the conduction band and valence band of tensile strained silicon on relaxed silicon germanium by curves 6 and 7, respectively. Electrons are confined in the tensile strained silicon which potentially has high electron mobility, and this material system may be suitable for nMOSFETs. With the two material systems, the channel could be a surface channel or a buried quantum well channel. In FIGS. 1-2, the ordinate represents energy and the abscissa represents depth.

Figure 3:
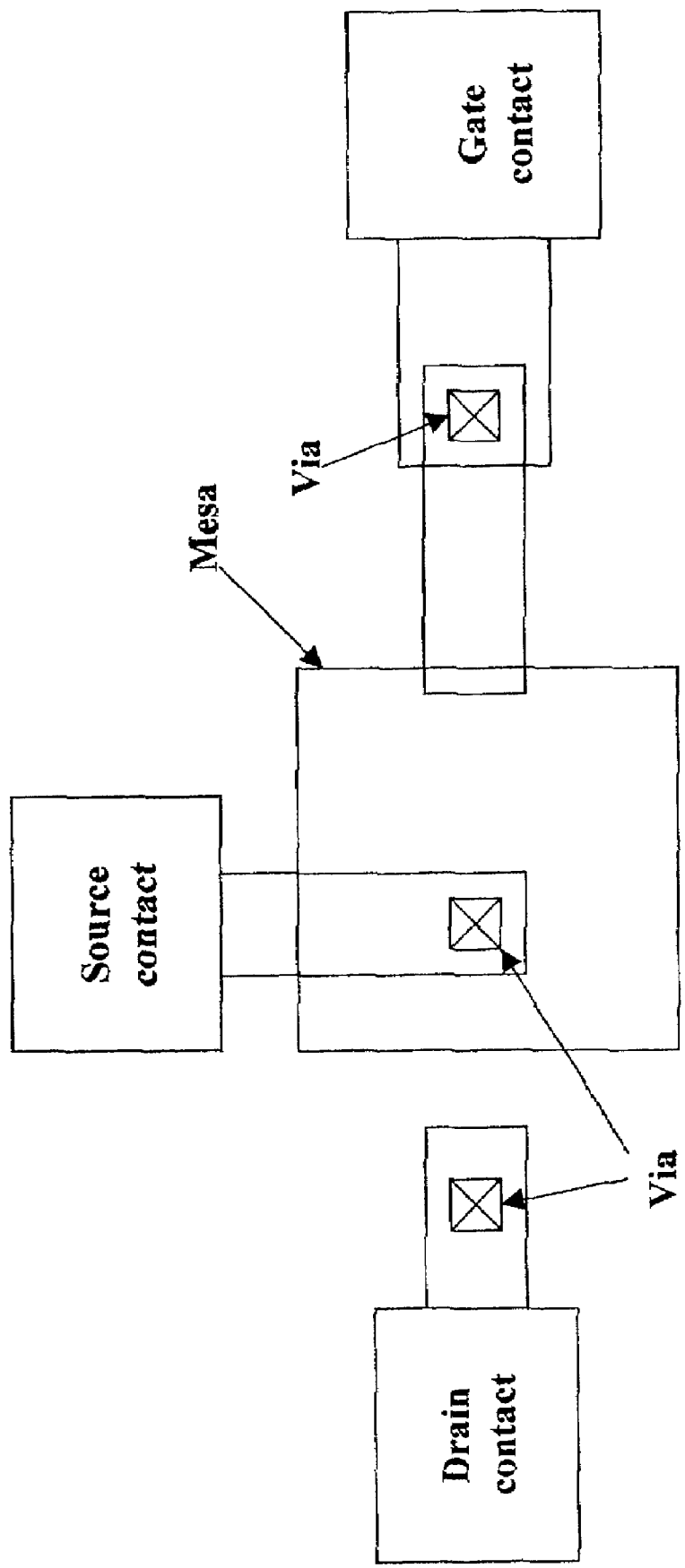
FIG. 3 is a top view of a vertical channel MOSFET.
Figure 4:
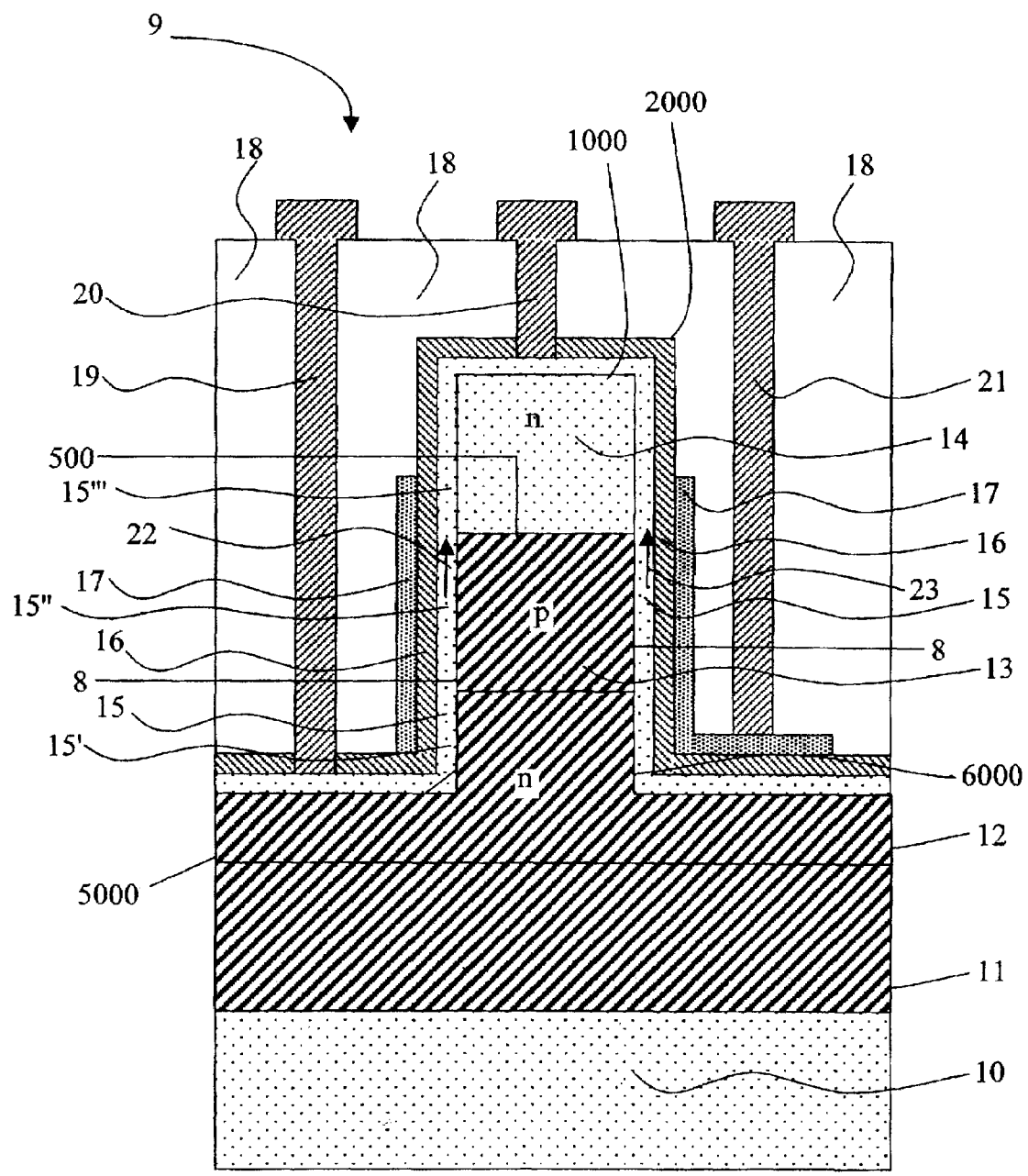
FIG. 4 is a cross sectional schematic of a vertical strained Si/SiGe surface channel nMOSFET according to the first embodiment of the present invention.

FIG. 3 shows a top view of a vertical device structure disclosed in this invention. FIG. 4 shows a cross-sectional view of the first embodiment. It is a SiGe based vertical nMOSFET 9 comprising a vertical mesa, a column, a pedestal, a pillar or a fin comprising several layers, such as a source layer 14, a body layer 13, and a drain layer 12, with a channel layer 15, an insulator layer 16, and a gate electrode layer 17 on the sidewalls of the mesa, column, pedestal, pillar or fin, which may be formed by etching layers 14, 13, and 12. The device has the following structural characteristics:

1) The drain is $n^+$-type relaxed SiGe 12;
2) The body is epitaxial p-type relaxed SiGe 13, and the doping level is adjusted to achieve the desirable threshold voltage;
3) The source is epitaxial $n^+$-type tensile strained Si 14;
4) The channel is epitaxial tensile strained Si 15, and there is no hetero-barrier along the current flow direction shown by arrows 22 and 23. The channel layer 15 forms a heterojunction with the body 13 at the interface 8 and functions to provide band offset as shown in FIG. 2 to confine electrons in the channel 15. Typically the channel is autodoped by the adjacent layer by dopant diffusion, such that the channel region 15" over the body 13 is p-type, and the channel regions 15' and 15''' over the source 14 and drain 12 are doped n-type.
5) A strained Si/SiGe heterojunction is formed between source 14 and body 13 at interface 500, and preferably, aligned with the source/body metallurgical p/n junction. The off-state current is reduced because the heterojunction functions to block electrons from entering body 13, hence reducing the off-state current by orders of magnitude. The higher the strain in one layer (source 14) of the heterojunction, the higher the energy barrier, the less the leakage current will be from the source through the body to the drain when the device is turned off (i.e., off state).

6) The gate is a conducting layer 17 overlapping the entire strained silicon channel 15 comprising regions 15', 15", 15''' with an insulator 16 in between. The gate extends to or overlaps part of the source 14 and drain 12. In order to reduce the gate-to-source/gate-to-drain overlap capacitance, the gate oxide overlapping the source 14 and the drain 12 can be made thicker than the oxide overlapping the body 13;

7) The drain, source and gate electrodes 19, 20 and 21 are connected to the drain 12, source 14 and gate 17, respectively;

8) Layer 10 and buffer layer 11 function to provide a relaxed SiGe template for epitaxial growth of drain 12. Layer 10 can be part of a silicon-on-insulator (SOI) substrate. Layer 10 and 11 may also be bulk Ge, Ge-on-insulator, SiGe-on-insulator, or silicon-on-sapphire (SOS). A bonded layer of suitable lattice spacing may be provided in place of substrate 10 and buffer layer 11.

Figure 5:
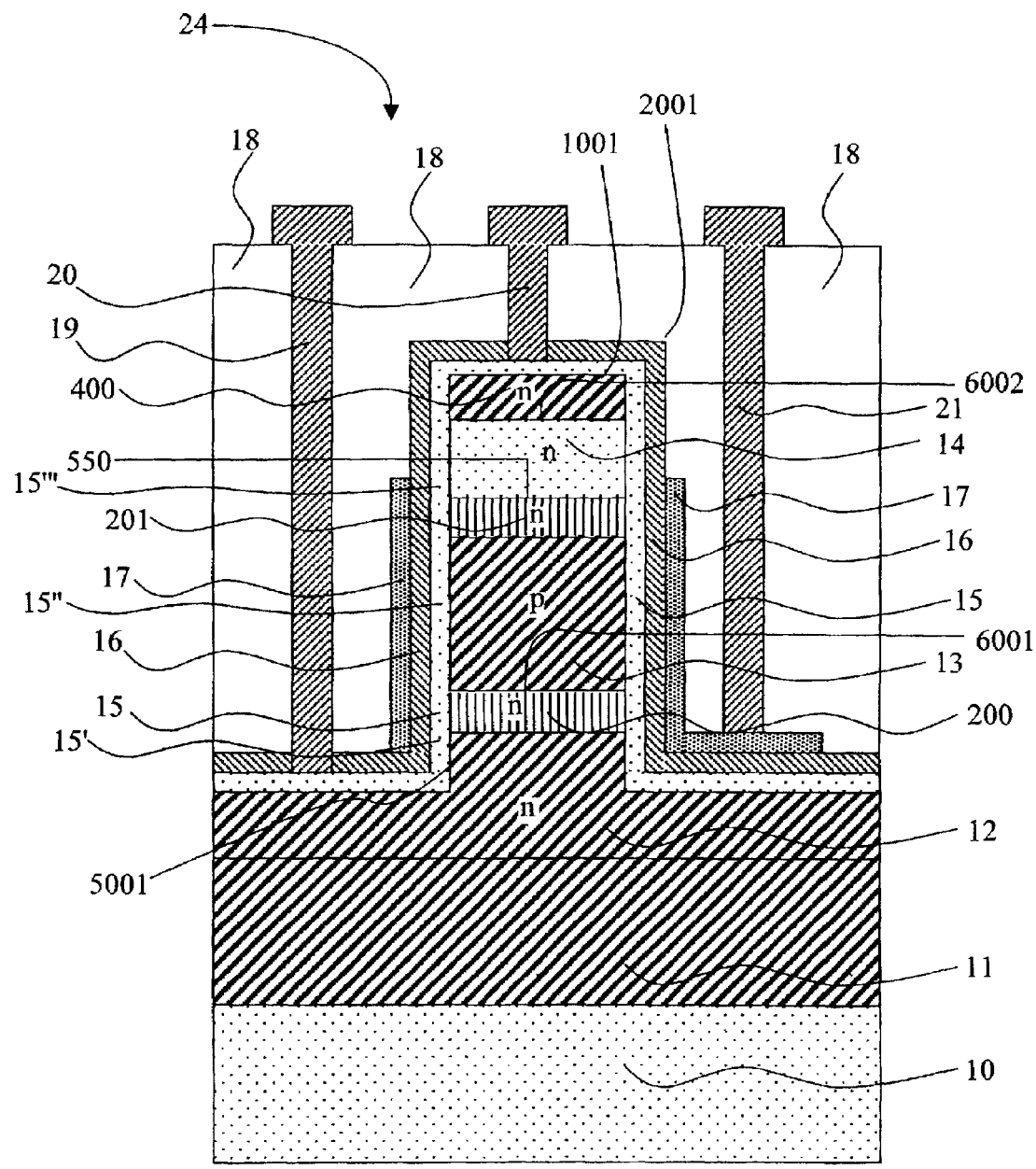
FIG. 5 is a cross sectional schematic of a vertical strained Si/SiGe surface channel nMOSFET with a diffusion barrier layer containing carbon and a composite source comprising a strained silicon layer and a relaxed SiGe layer or poly silicon or poly SiGe layer according to the second embodiment of the present invention.

In the case when the source/drain is phosphorus-doped, phosphorus diffusion from the source/drain into the channel and the body will tend to short the source and drain in ultra-short channel devices. Adding an epitaxial SiGeC layer 200 and 201 as shown in FIG. 5 can reduce phosphorus diffusion. This is the second embodiment of the present invention. It is a nMOSFET 24 with a similar structure to the first embodiment, except that SiGeC layers 200 and 201 are included to block phosphorus diffusion from layer 12 and 14, respectively. When silicon layer 14 is highly strained, its critical thickness is rather small. The more strain in the layer, the thinner is the critical thickness at which the stained layer starts to relax. The critical thickness is understood in the art as a thickness where defects are generated within a layer to relieve its strain so that the layer relaxes towards its natural lattice spacing. The lattice spacing is determined by the composition of the layer as well as the degree of relaxation, which is typically assumed to be 100%. For example, Ge lattice is 1.04 times the lattice spacing of silicon. A 50% Ge composition in a SiGe layer would be expected to have a lattice spacing of 1.02 times the lattice spacing of silicon. In this embodiment, a relaxed SiGe layer or poly silicon or poly SiGe layer 400 is formed on top of strained silicon layer 14, and together they form the composite source that has sufficient thickness for silicidation. Layer 400 can be as thick as desired while layer 14 has a thickness below or about the critical thickness. When the thickness of SiGeC layers 200, 201, and SiGe 400 are zero, the second embodiment falls back to the first embodiment.

Figure 6:
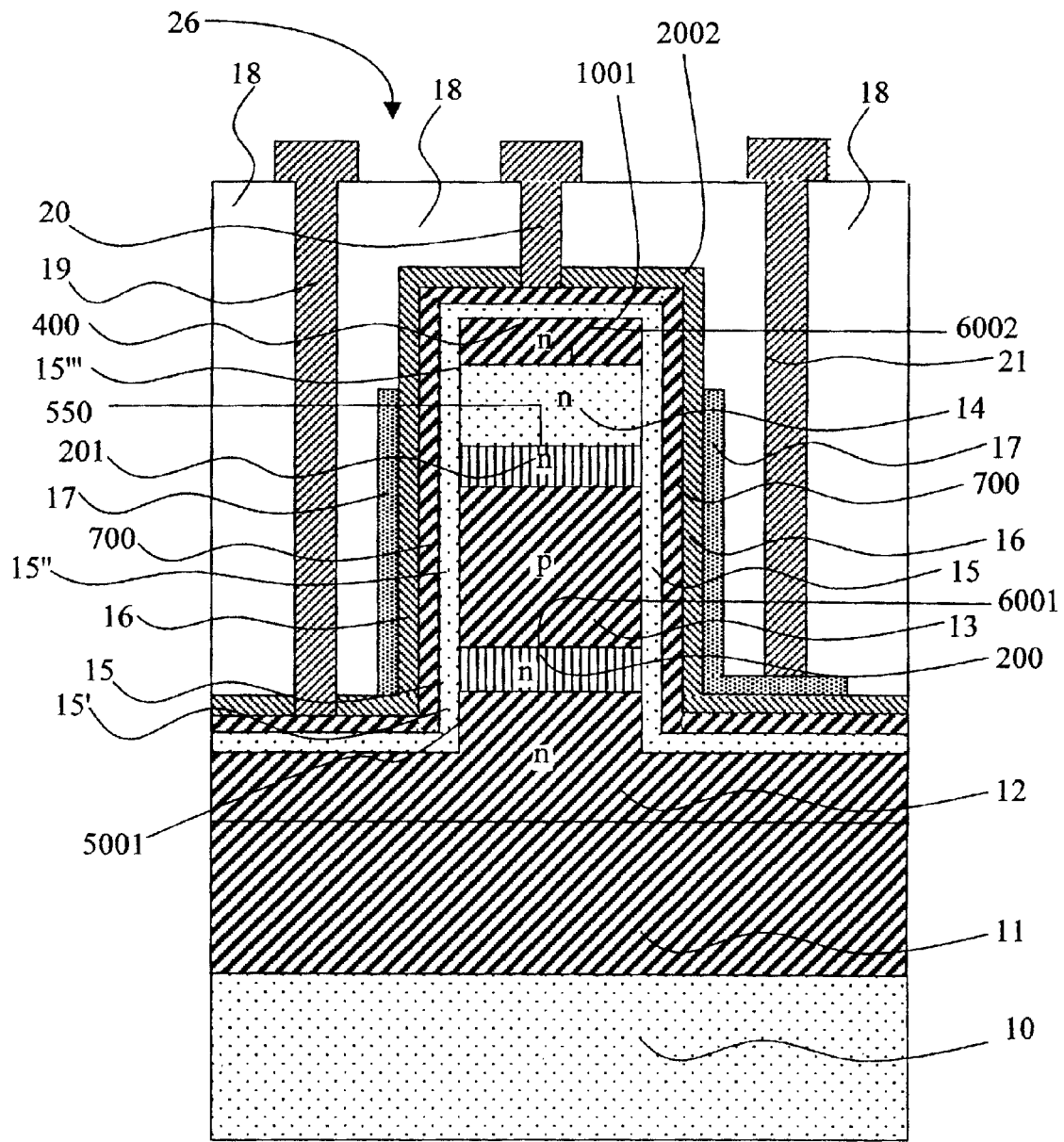
FIG. 6 is a cross sectional schematic of a vertical strained Si/SiGe buried channel nMOSFET with a diffusion barrier layer containing carbon and a composite source comprising a strained silicon layer and a relaxed SiGe layer or poly silicon or poly SiGe layer according to the third embodiment of the present invention.

The first two embodiments which are shown in FIGS. 4 and 5 have a tensile strained silicon surface channel 15. Strain-induced higher electron mobility gives higher drive current compared to conventional Si channels. However, for some low noise applications, the surface roughness scattering is undesirable and preferably eliminated. In this case, a buried quantum well channel is more desirable. As such for a buried channel, electrons are confined as a 2-dimensional gas within the quantum well, and importantly, will be able to maintain its higher mobility since there is no surface scattering problem. The cross sectional schematic of the third embodiment of a nMOSFET 26 in the present invention is shown in FIG. 6. It has a similar structure to the second embodiment, with a buried strained silicon channel 15 which has a higher mobility due to reduced surface roughness scattering, a SiGe cap layer 700, an insulator layer 16 and a gate electrode layer 17 on the sidewall of the mesa or column or pedestal or pillar or fin, referred to FIG. 6.

The above three embodiments require a relaxed SiGe buffer layer in order to provide a lattice spacing different from bulk silicon. Typically this relaxed SiGe buffer layer is comprised of a relaxed SiGe with constant Ge content grown over a linearly or step graded SiGe structure.

Figure 7:
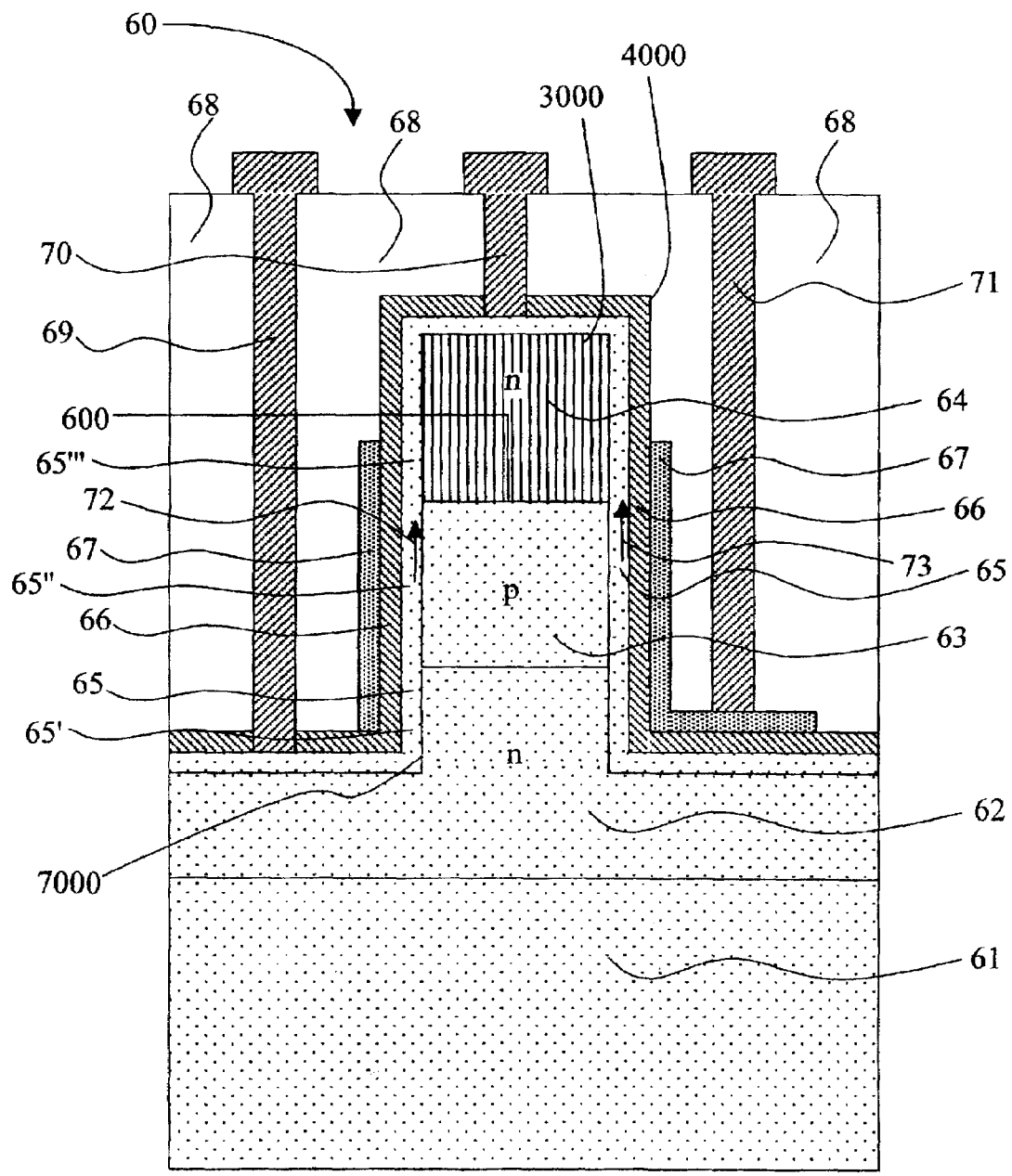
FIG. 7 is a cross sectional schematic of a vertical strained SiC/Si surface channel nMOSFET according to the forth embodiment of the present invention.

In order to circumvent this problem, another hetero-material system may be used for nMOSFETs. Tensile strained $Si_{1-x-y}Ge_xC_y$ on silicon also has the desired conduction band offset, and in this case it does not require a relaxed SiGe virtual substrate. The cross sectional schematic of the fourth embodiment is shown in FIG. 7 for such a vertical surface channel device 60. The device has the following structure characteristics:

1) The drain is n$^+$-type silicon 62;
2) The body is p-type silicon 63, and the doping level is adjusted to achieve desirable threshold voltage;
3) The source is n$^+$-type tensile strained $Si_{1-x-y}Ge_xC_y$ 64;
4) The channel is silicon or strained $Si_{1-a-b}Ge_aC_b$ 65, and there is no hetero-barrier along the current flow direction shown by arrows 72 and 73;
5) A strained $Si_{1-x-y}Ge_xC_y$/Si heterojunction is formed between the source and the body at the interface 600, and preferably, aligned with the source/body metallurgical p/n junction;
6) The gate is a conducting layer 67 overlapping the entire channel 65 and part of the source 64 and drain 62 with an insulator 66 in between;
7) Layer 61 may be bulk silicon or SOI substrate (not shown). Layer 61 and 11 may also be bulk Ge, Ge-on-insulator, SiGe-on-insulator, SOS.

Figure 8:
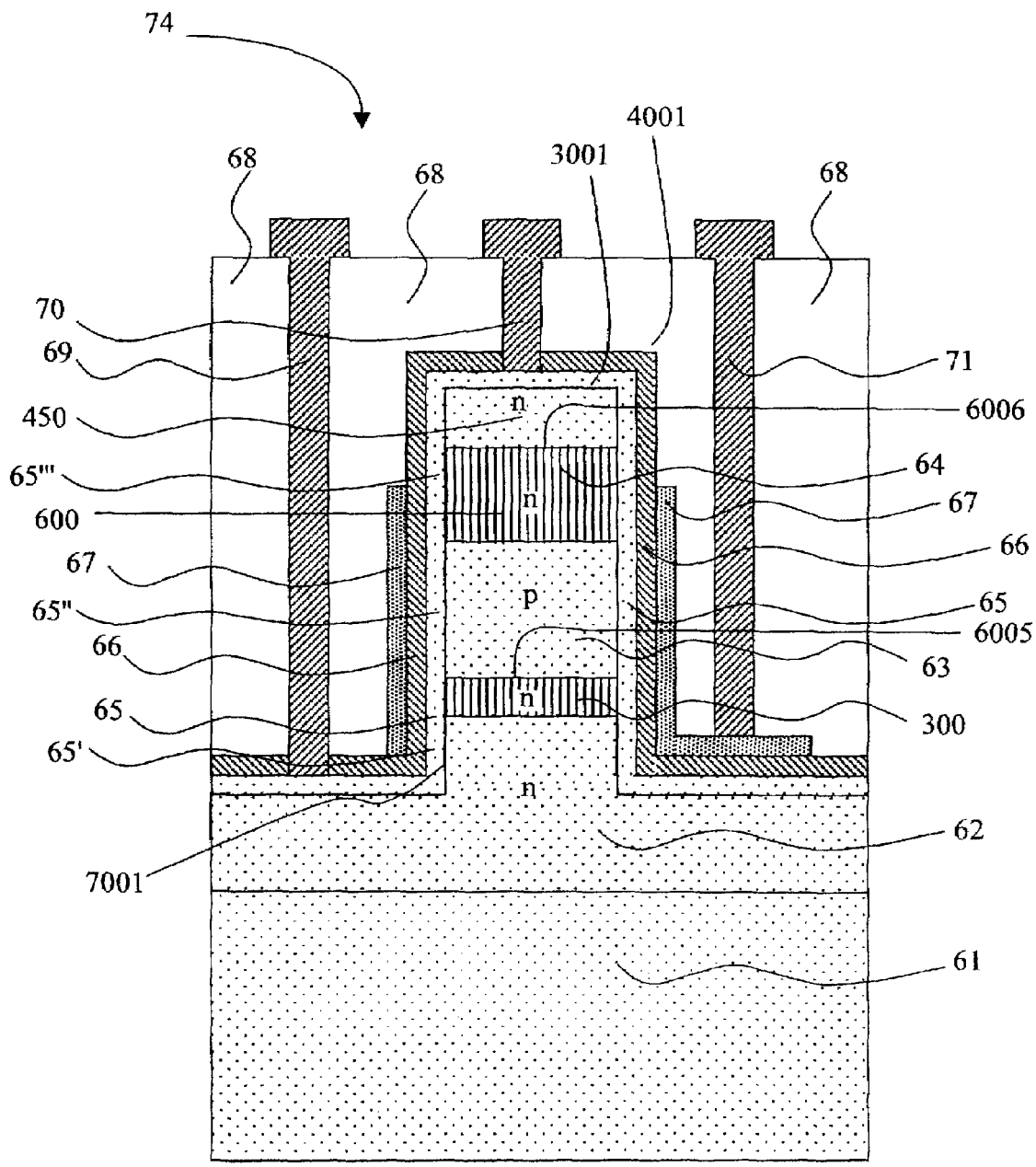
FIG. 8 is a cross sectional schematic of a vertical strained SiC/Si surface channel nMOSFET with a diffusion barrier layer containing carbon and a composite source region consisting of a strained SiC layer and a relaxed silicon layer or poly silicon or poly SiGe layer according to the fifth embodiment of the present invention.

In order to reduce phosphorus diffusion from the drain into the channel of a nMOSFET 74, SiGeC layer 300 is introduced into the drain as shown in FIG. 8. When SiGeC layer 64 is highly tensile strained, its critical thickness is rather small. Therefore, a relaxed silicon or poly silicon or poly SiGe or poly SiGeC layer 450 is introduced to form a composite source such that the source has sufficient thickness for silicidation. When the thickness of SiGeC layer 300 and relaxed silicon or poly silicon or poly SiGe or poly SiGeC layer 450 are zero, the fifth embodiment falls back to the fourth embodiment shown in FIG. 7. Similarly, a buried strained SiGeC channel device can also be formed with a silicon cap between the SiGeC channel 65 and insulator 66, analogous to FIG. 6 where a SiGe cap layer 700 is shown between channel layer 15 and insulator layer 16.

Figure 9:
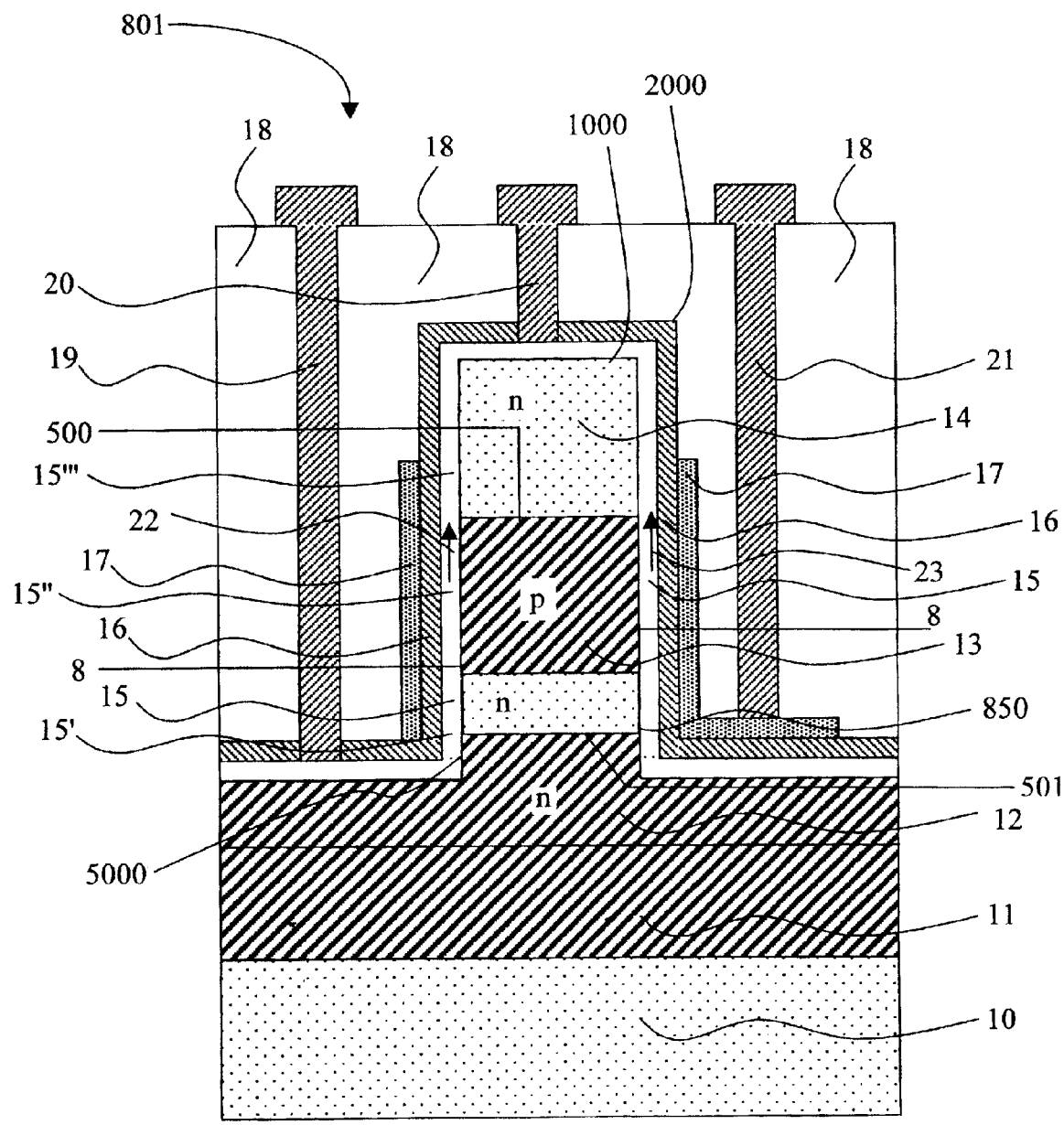
FIG. 9 is a cross sectional schematic of a vertical strained Si/SiGe surface channel nMOSFET which has a heterojunction at both source and drain junctions according to the sixth embodiment of the present invention.

Note that the above five embodiments are all asymmetric devices, which have a heterojunction only between the source and the body. For certain circuit applications, such as transmission gate circuits, the devices are preferred to be symmetric. The sixth embodiment of the present invention, shown in FIG. 9, is a surface channel nMOSFET 801. It has a similar structure to the first embodiment, but has a composite drain which comprises a thin strained silicon layer 805 and relaxed SiGe layer 12. In this structure, the silicon layers 14 and 805 should and may have the same amount of strain. Therefore, the heterobarriers at both source and drain junctions would have the same height and hence, the device is close to a symmetric device.

According to the preferred embodiment, this invention further comprises the scheme for process integration for a vertical high mobility heterojunction nMISFET:

1) Epitaxial growth of a stack of several layers for the drain, body, and the source with or without in-situ doping;
2) Patterning/etching to form a mesa, or pedestal, or pillar, or column, or fin;
3) Epitaxial growth of the channel layer, the cap layer if desired, on the sidewall of the mesa or pedestal, or pillar, or column, or fin;
4) Growth or deposition of the insulator layer, which may be an oxide, oxynitride, other high-permittivity dielectrics, or a combination thereof;
5) Growth or deposition of the gate electrode layer, which may be poly silicon, poly SiGe or metal, on the sidewall of the mesa, or pedestal, or pillar, or column, or fin;
6) Ion implant and annealing if the source, drain, body, or the poly Si or poly SiGe gate electrode is not in-situ doped;
7) Gate patterning and etching;
8) Field oxide deposition;
9) Contact opening;
10) Source/drain silicidation;
11) Metallization and metal sintering.

While there has been described and illustrated a semiconductor device containing a high mobility channel and a heterojunction which preferably coincides with the junction of source and/or drain, it will be apparent to those skilled in the art that modifications and variations are possible without deviating from the broad scope of the invention which shall be limited solely by the scope of the claims appended hereto.

The invention claimed is:

1. A strained silicon channel for a vertical field effect transistor comprising:

a substrate having a relaxed n-type $Si_{1-y}Ge_y$ ($0 \leq y \leq 1$) epitaxial region and said first region having a doping concentration greater than $1 \times 10^{19}$ atoms/cm$^3$;

a relaxed $Si_{1-a-b}Ge_aC_b$ ($0 \leq a \leq 1$, $0 \leq b \leq 1$) epitaxial region over said first relaxed n-type $Si_{1-y}Ge_y$ epitaxial region;

a p-type $Si_{1-z}Ge_z$ ($0 \leq z \leq 1$) epitaxial region over said relaxed $Si_{1-a-b}Ge_aC_b$ epitaxial region;

a relaxed $Si_{1-e-f}Ge_eC_f$ ($0 \leq e \leq 1$, $0 \leq f \leq 1$) epitaxial region over said p-type $Si_{1-z}Ge_z$ epitaxial region;

a strained n-type silicon epitaxial region over said relaxed $Si_{1-e-f}Ge_eC_f$ epitaxial region having a doping concentration greater than $1 \times 10^{19}$ atoms/cm$^3$;

a vertical structure comprising at least one sidewall extending from said relaxed n-type $Si_{1-y}Ge_y$ epitaxial region, over said region of $Si_{1-a-b}Ge_aC_b$, over said region of $Si_{1-z}Ge_z$ region, over said region of $Si_{1-e-f}Ge_eC_f$ and over said region of strained n-type silicon epitaxial region; and a strained silicon epitaxial region over a region of said at least one sidewall of said vertical structure extending from said region of $Si_{1-a-b}Ge_aC_b$, over said region of $Si_{1-z}Ge_z$ region, to said region of $Si_{1-e-f}Ge_eC_f$.

2. The strained silicon channel of claim 1, further including:

a gate dielectric region over said strained silicon epitaxial region; and a conducting region over said gate dielectric region.

3. The strained silicon channel according to claim 1, wherein said relaxed $Si_{1-a-b}Ge_aC_b$ region is doped n-type in the range from $1 \times 10^{16}$ to $1 \times 10^{21}$ atoms/cm$^3$.

4. The strained silicon channel according to claim 1, wherein said relaxed $Si_{1-e-f}Ge_eC_f$ region is doped n-type in range from $1 \times 10^{16}$ to $1 \times 10^{21}$ atoms/cm$^3$.

5. The strained silicon channel according to claim 1, wherein said strained silicon region comprises an autodoped n-type in a region adjacent to said relaxed n-type $Si_{1-y}Ge_y$ epitaxial region and to said strained n-type silicon epitaxial region, while autodoped p-type in a region adjacent to said p-type $Si_{1-z}Ge_z$ epitaxial region.

6. The strained silicon channel according to claim 1, wherein said strained silicon region is grown to a thickness less than a critical thickness with respect to a lattice spacing of said relaxed SiGe region.

7. The strained silicon channel according to claim 1, further including a relaxed $Si_{1-h}Ge_h$ ($0 \leq h \leq 1$) region over said strained n-type silicon epitaxial region, said $Si_{1-h}Ge_h$ doped n-type to a concentration level greater than $1 \times 10^{19}$ atoms/cm$^3$, and wherein said vertical structure has at least one sidewall including a portion of said sidewall formed from said region of $Si_{1-h}Ge_h$.

8. The strained silicon channel according to claim 7, wherein said region comprising poly silicon or poly SiGe.

9. The strained silicon channel of claim 1, further comprising:
  a relaxed $Si_{1-g}Ge_g$ ($0 \leq g \leq 1$) region over said strained silicon region extending from said region of $Si_{1-a-b}Ge_aC_b$, over said region of $Si_{1-z}Ge_z$ region, to said region of $Si_{1-e-f}Ge_eC_f$.

10. A strained silicon channel for a vertical field effect transistor comprising:
  a substrate having a region and said relaxed n-type $Si_{1-y}Ge_y$ ($0 \leq y \leq 1$) epitaxial region having a doping concentration greater than $1 \times 10^{19}$ atoms/cm$^3$;
  a n-type strained silicon epitaxial region over said relaxed n-type $Si_{1-y}Ge_y$ epitaxial region;
  a p-type $Si_{1-z}Ge_z$ ($0 \leq z \leq 1$) epitaxial region over said strained n-type silicon epitaxial region;
  a strained n-type silicon epitaxial region over said p-type $Si_{1-z}Ge_z$ epitaxial region, said strained n-type silicon epitaxial region having a doping concentration level greater than $1 \times 10^{19}$ atoms/cm$^3$;
  a vertical structure comprising at least one sidewall extending from said relaxed n-type $Si_{1-y}Ge_y$ epitaxial region over said strained silicon region over said $Si_{1-z}Ge_z$ epitaxial region to said strained n-type silicon epitaxial region; and
  a strained silicon epitaxial region over a region of said at least one sidewall of said vertical structure extending from said relaxed n-type $Si_{1-y}Ge_y$ epitaxial region over said strained silicon region over said $Si_{1-z}Ge_z$ epitaxial region to said strained n-type silicon epitaxial region.

11. The strained silicon channel of claim 10, further including:
  a gate dielectric region over said strained silicon epitaxial region; and
  a conducting region over said gate dielectric region.

12. The strained silicon channel according to claim 11, wherein said gate dielectric region is selected from the group consisting of an oxide, nitride, oxynitride of silicon, and oxides and silicates of Hf, Al, Zr, La, Y, Ta, singly or in combination.

13. The strained silicon channel according to claim 11, wherein said conducting region is selected from the group consisting of a metal, metal silicide, a doped poly silicon and a doped poly SiGe.

14. The strained silicon channel of claim 10, further comprising:
  a blanket dielectric region over and above said vertical structure;
  a conducting via through said blanket dielectric region in electrical contact to said relaxed n-type $Si_{1-y}Ge_y$ epitaxial region;
  a conducting via through said blanket dielectric region in electrical contact to said fourth strained n-type silicon epitaxial region; and
  a conducting via through said blanket dielectric region in electrical contact to said conducting region.

15. The strained silicon channel according to claim 10, further comprising:
  a $Si_{1-x}Ge_x$ ($0 \leq x \leq 1$) epitaxial region having a germanium profile content selected from the group consisting of a linear graded germanium content x and a step graded germanium content x.

16. The strained silicon channel according to claim 10, wherein said second n-type silicon epitaxial region is strained with respect to the upper surface of said first relaxed n-type $Si_{1-y}Ge_y$ epitaxial region.

17. The strained silicon channel according to claim 10, wherein said p-type $Si_{1-z}Ge_z$ epitaxial region is relaxed with respect to an upper surface of said relaxed n-type $Si_{1-y}Ge_y$ epitaxial region.

18. The strained silicon channel according to claim 10, wherein said vertical structure is formed by one of reactive ion etching and ion beam milling.

19. The strained silicon channel according to claim 10, wherein said at least one sidewall of said vertical structure is in a plane (100), and perpendicular to a major surface of said substrate.

20. The strained silicon channel according to claim 10, wherein said strained silicon epitaxial region on said at least one sidewall of said vertical structure is strained with respect to said relaxed n-type $Si_{1-y}Ge_y$ epitaxial region.

21. The strained silicon channel according to claim 10, wherein said strained silicon epitaxial region is doped n-type in the respective regions adjacent to said relaxed n-type $Si_{1-y}Ge_y$ epitaxial region and said strained n-type silicon epitaxial region, while autodoped p-type in the region adjacent to said p-type $Si_{1-z}Ge_z$ epitaxial region.

22. The strained silicon channel according to claim 10, wherein said strained silicon region is grown to a thickness less than a critical thickness with respect to a lattice spacing of said relaxed SiGe region.

* * * * *